United States Patent
Kella et al.

(10) Patent No.: US 6,545,277 B1
(45) Date of Patent: Apr. 8, 2003

(54) HIGH EFFICIENCY, ENHANCED DETECTING IN-LENS LIGHT GUIDE SCINTILLATOR DETECTOR FOR SEM

(75) Inventors: Dror Kella, Nes Ziona (IL); Betsalel Rechav, Kiryat Tivon (IL)

(73) Assignee: Applied Materials, Inc., Santa Clara, CA (US)

( * ) Notice: Subject to any disclaimer, the term of this patent is extended or adjusted under 35 U.S.C. 154(b) by 113 days.

(21) Appl. No.: 09/638,505

(22) Filed: Aug. 15, 2000

(51) Int. Cl.[7] ............................................. H01J 37/244
(52) U.S. Cl. ...................................... 250/310; 250/397
(58) Field of Search ................................. 250/310, 397

(56) References Cited

U.S. PATENT DOCUMENTS

| | | | |
|---|---|---|---|
| 4,149,074 A | 4/1979 | Schliepe et al. | 250/311 |
| 4,217,495 A * | 8/1980 | Robinson | 250/310 |
| 4,831,266 A | 5/1989 | Frosien et al. | 250/347 |
| 5,466,940 A | 11/1995 | Litman et al. | 250/397 |
| 5,495,238 A * | 2/1996 | Baker et al. | 340/870.02 |
| 5,517,033 A * | 5/1996 | Krivanck et al. | 250/397 |
| 5,872,358 A * | 2/1999 | Todokoro et al. | 250/310 |
| 6,031,230 A * | 2/2000 | Toumatsu | 250/310 |
| 6,211,525 B1 * | 4/2001 | Cowham | 250/310 |
| 6,236,053 B1 * | 5/2001 | Shariv | 250/310 |

* cited by examiner

*Primary Examiner*—Bruce Anderson
(74) *Attorney, Agent, or Firm*—Michael B. Einschlag

(57) ABSTRACT

A high efficiency enhanced detecting light guide scintillator detector for charged particle beam apparatus, wherein primary beam passes through the light guide scintillator detector. Light guide scintillator detector is formed as a fork-like part having an open area covering effectively the same area in which the shadow of the primary beam shielding causes low efficiency detection of impinging charged particles. There is further provided a conductive grid or mesh-sheet fitted in the open area between the prongs of the fork-like part biased at various electric potentials inducing one out of many desired possible interactions with detected charged particles such as e.g. deflection and generation of SE's.

91 Claims, 7 Drawing Sheets

PRIOR ART

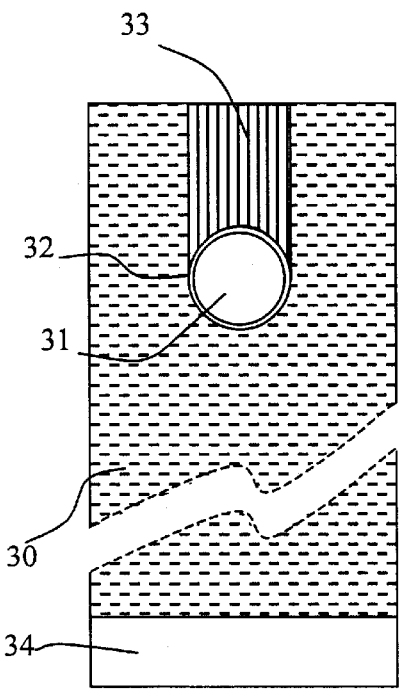
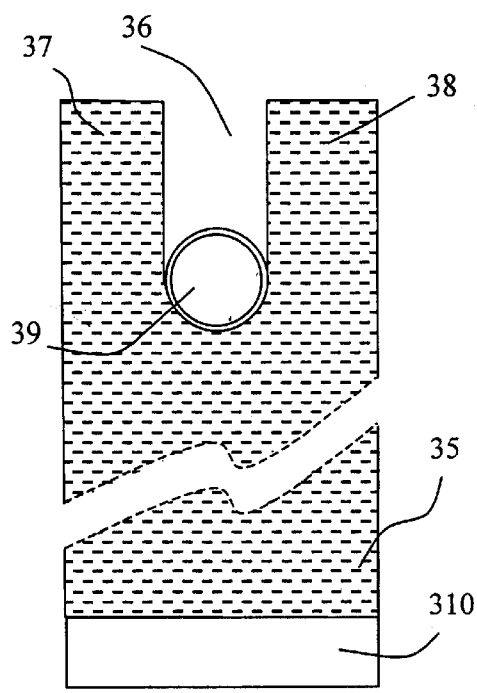
Fig. 3 A  PRIOR ART
Fig. 3 B

HIGH EFFICIENCY, ENHANCED DETECTING IN-LENS LIGHT GUIDE SCINTILLATOR DETECTOR FOR SEM

FIELD OF THE INVENTION

The present invention relates to charged particle beam detection apparatus and in particular to a charged particle detector wherein a primary beam passes through the detector.

BACKGROUND OF THE INVENTION

For general background information reference is made to: "Sem Notes #1" (website: http://www.uga.edu/~caur/semnote1.htm); and "Scanning Electron Microscopy", L. Reimer, Springer-Verlag, ISBN 3-540-13530-8 and ISBN 0-387-13530-8. For prior art particle detectors reference is made to: U.S. Pat. No. 4,149,074 Schliepe et al April 1979, U.S. Pat. No. 4,831,266 Frosien et al May 1989, U.S. Pat. No. 5,466,940 Litman et al November 1995.

A Scanning Electron Microscope (SEM) consists of inter alia, an electron source emitting a current of charged particles (the primary beam), an acceleration system for the charged particles, a steering and focusing system which brings the charged particles to a finely focused point on a sample and a scanning mechanism which causes the focal point to scan the sample in a controlled predefined manner. Charged particles which are created due to the interaction of the primary beam with the sample (secondary beam) scatter in the sample chamber. A detector collects these created charged particles (foremost secondary electrons or in short, SE's) utilizing an electromagnetic field. It should be noted that a multitude of particles are created in the above-mentioned interaction, such as inter alia, backscattered electrons (BSE's), Auger and X-Ray electrons, but are in following description not further discussed. In a widely common detection scheme, called in-lens detection, the secondary electrons (SE's) are pulled back into the microscope, in where an electron detector is placed somewhere close to the original path of the primary beam inside the microscope (in-lens detector). Another detection scheme wherein the detector is positioned somewhere in the chamber is herein not further discussed by virtue of its substantially different operation.

There follows now a description of prior art in-lens detection schemes.

In FIG. 1 a prior art detector is shown, wherein scintillator 10 is positioned near or on light guide 11 and consists commonly of a phosphor or plastic or crystal scintillator. Light guide 11 is coupled to photomultiplier tube 12. Primary particle beam 13 passes through the light guide 11 and scintillator 10 by means of primary beam shielding 14. A protective sleeve 15 shields primary particle beam from the electrical field of the scintillator anode, biased at an electric potential of several kV's above $V_{COLUMN}$. Column electric voltage potential ($V_{COLUMN}$) is the electric potential of the beam transport tube or structure surrounding the detector along the primary beam path. Both primary beam shielding 14 and protective sleeve 15 are at $V_{COLUMN}$ electric potential. Thus, the primary beam does not experience any influence caused by electric fields originating from the significantly high electrical potential of the detector anode. After primary particle beam impinges on sample 16, held at a defined electric potential $V_{SAMPLE}$, charged particles 17 are accelerated into lens 110, due to the electric potential difference between the sample and the column, and finally impinge on scintillator 10. The energy needed to create a signal from the charged particles on the scintillation material is gained, in prior art, by the above-mentioned electric potential difference between the column and the sample. FIG. 2 illustrates schematically the scintillator area in more detail. Scintillator 20 is attached to or forced on light guide 21. Photons generated by the scintillator are directed through light guide 21 toward photomultiplier tube 22 that generates the electric signal representative of the number of charged particles impinging on it. Primary beam shielding 23, through which the primary beam passes, is positioned inside a hole 24 in light guide 21. A multitude of charged particles 25 after being generated by the interaction between the primary particle beam and the sample are accelerated towards scintillator 20 by the electric potential difference between the column and the sample.

Hole 24 is substantially responsible for creating an area 26 in which photons generated by impinging charged particles 27 are obstructed from reaching photomultiplier tube 22. This area is therefore distinguished from the rest of the scintillator by its low efficiency properties, also commonly referred to as the "shadow" area of the primary beam shielding. Charged particles impinging onto the "shadow" area do contribute less to the generation of the image resulting from the transformation of photons to an electric signal by the photomultiplier tube, thus creating distinctive shadowing, detrimental to optimum detection performance.

There is accordingly a need in the art to provide for a system that substantially reduces or eliminates the shadowing effect of in-lens light guide scintillator detectors, and allow additional amplification of the signal without changing the general beam transport conditions, achieving improved and possibly uniform detection.

SUMMARY OF THE INVENTION

For purpose of clarity the acronyms SE and BSE are respectively used for secondary electron and backscattered electron in all discussions and claims below and more generally, relate to charged particles or electrons.

It should be noted that in the discussions below the phrase "in-lens detector" is generally applicable to any detector wherein the primary beam passes through.

Furthermore, it is appreciated that the reference to Scanning Electron Microscope (SEM), does not limit or confine the present invention in any way and is generally applicable to any charged particle beam detection apparatus.

In accordance with the preferred embodiment of the present invention, there is provided a high efficiency, enhanced detecting light guide of an in-lens detector for SEM, having a variable electric potential on the scintillator surface and having an open area. In the preferred embodiment, instead of being set at $V_{COLUMN}$ and open to the rest of the system, the scintillator surface is electrically isolated from its surroundings and biased at a higher electrical potential, bringing about impingement of electrons with greater energy. The higher energy results in more light being produced per electron and this leads to higher detection efficiency. The scintillator is shielded from the rest of the system by one, and preferably two grids. The external grid is set at $V_{COLUMN}$ and thus prohibits disturbance of the primary beam. The second, inner grid may be set at a low electric potential, which will inhibit some, or all, of the electrons from reaching the scintillator. This grid may be used as a high pass energy filter for the incoming electrons.

The electric field created between the grid and the scintillator is used to direct the electrons away from the "shadow" region (26 of FIG. 2). This is accomplished by creating an open area instead of the "shadow" region. The open area results in shaping the light guide and scintillator into fork-like parts, with the two sides of the fork-like parts protruding as prongs. A primary beam shielding is situated in the open area between the prongs of the fork-like part facilitating passage of primary particle beam. The open area covers substantially the same area where the shadow of the primary beam shielding causes low efficiency detection of impinging electrons.

In accordance with another embodiment there is provided a conductive grid or mesh-sheet fitted in the open area between the prongs of the fork-like part. The electric potential, shape and position of the conductive grid can be determined to achieve one out of many desired possible interactions with charged particles (inter alia, SE and BSE electrons), such as e.g. deflection and generation of SE's. Maintaining the conductive grid or mesh-sheet at a low enough electric potential below the kinetic energy of the fastest electrons originating from the sample induces deflection, away from the open area between the prongs of the fork-like part, consequently contributing toward substantially uniform electron detection. Thus achieving a substantial decrease of electrons not being detected, independent of where the electrons hit the detection area.

The conductive grid, situated in the open space, can optionally be replaced by a conductive metal foil, having for example, a tent-like shape, covering in various ways the open area of the fork-like part. Since, under some conditions, not all electrons with high kinetic energies will be deflected sufficiently by the electric potential of the foil to impinge on the high efficiency area of the detector, a given percentage will impinge on the foil. The foil, which may have a high emissive coating, will therefore produce SE's by the impingement. These SE's will be accelerated toward the scintillator anode biased at a positive electric potential, relative to the foil. Applying appropriate deflection means, being part of the lens optics, the SE's but particularly BSE's having high kinetic energies, can be deflected toward the conductive foil inducing impingement substantially only on the conductive foil so that no irreversible damage will be induced to the surface of the scintillator. Irreversible damage is potentially possible when electrons having high kinetic energy impinge on the scintillator in such manner, that the transformation process of electrons into photons will not constitute an ideal adiabatic process (a process that occurs without loss or gain of heat). Thermal damage due to non-adiabatic transformation of electrons into photons is also possible when the detected beam (the beam or stream of electrons emanating from the sample caused by interaction of primary particle beam impinging on the sample) exhibits a crossover point at or very near to the position of the scintillator. Secondary electrons produced on the foil are, in turn, attracted to the scintillator and spread over it to produce a signal from a large region. This embodiment is significant when the detected electron beam has a small geometrical cross-section (also called low-profile) on the detector. Spreading the electrons over the detector reduces local radiation damage on the scintillator. It also reduces artifacts in detection due to local variances in the scintillator.

The conductive foil thus effectively enables transformation of focused, high kinetic energy electrons into unfocused, low kinetic energy electrons. In addition, an increase in amount of generated electrons is achieved by a coating from a choice of suitable high emissive materials to produce more than one secondary electron for each electron impinging on it. Thus enhanced detection sensitivity is additionally achieved. In another embodiment the above-described functionality of the conductive foil is achieved by a known per se MCP (Micro Channel Plate) device, further increasing amount of generated SE's. In addition, a spread of SE's over substantially the entire scintillator area is achieved, thus avoiding non-linear scintillator response due to local saturation of the scintillator.

The primary particle beam is protected or shielded from the electrical field of the scintillator by a conductive sleeve or box, effectively encapsulating the scintillator. The protective box features a grid or mesh-sheet at the entrance side facing the sample to facilitate passing through of electrons emanating from the sample. Grid, protective box and primary beam shielding are electrically connected to an electric potential equal to the electric potential $V_{COLUMN}$ in the vicinity of the detector. Inside the protective box is optionally accommodated one or more grids, biased at defined various electric potentials, lower than detected beam energy electric potential, to achieve variable high-pass energy filtering of electrons.

In another preferred embodiment, the grid closest to the scintillator is replaced by a Micro Channel Plate (MCP). The external face of the MCP is set commonly at $V_{COLUMN}$ or $V_{FILTER}$, depending if the system is used in a filtered (two grid) configuration or unfiltered (single grid) configuration. The back side of the MCP is set at the appropriate electric potential and the scintillator is set at a higher electric potential, typically, a few kV's. Electrons striking the MCP, start a cascade which end with the emission of a substantial amount of electrons. These electrons are accelerated towards the scintillator anode of which the shadow region is open. In this configuration, the increase in efficiency is achieved by the multitude of electrons created by means of the MCP, rather than the energy of the electrons impinging onto the scintillator anode. Furthermore, the special "unshadowed" (open area) configuration of the light guide and scintillator resulting in a significantly homogeneous detection.

Thus, in accordance with one embodiment there is provided:

a high efficiency charged particle beam detector, comprising:
(a) a photon-detection element;
(b) a scintillator for producing photons from detected charged particles that impinge on said scintillator, the scintillator having an open area, substantially replacing a region in said scintillator manifesting low efficiency detection;
(c) a light guide associated with said scintillator for transferring said photons to said photon-detection element, said light guide having an open area, substantially conform in size and position with said open area of said scintillator
(d) a primary beam shielding facilitating passing through of said primary particle beam without substantial hindrance or affect from electrical field of said scintillator, said primary beam shielding accommodated near said open area; and
(e) a conductive part, accommodated within said open area of said light guide for inducing at least one out of various interactions between said detected charged particles and said conductive part.

Furthermore, in accordance with another embodiment, there is provided:

a high efficiency charged particle beam detector, for use with a Scanning Electron Microscope (SEM), comprising:

(a) a photon-detection element;
(b) a scintillator for producing photons from detected charged particles that impinge on said scintillator, the scintillator having an open area, substantially replacing a region in said scintillator manifesting low efficiency detection; comprising:
   (i) an insulating base material;
   (ii) a conductive layer disposed on said insulating base material, said conductive layer constituting a scintillator anode to bias said scintillator at a defined electric potential; and
   (iii) a scintillating layer or element, disposed to or forced onto or under said conductive layer, or disposed between said conductive layer and said insulating base material;
(c) a light guide associated with said scintillator at one end of said light guide for transferring said photons to said photon-detection element at other end of said light guide, having an open area conform in size and position with said open area of said scintillator;
(d) said scintillator and said light guide having a hole through which said primary beam protrudes; and
(e) a protective sleeve encapsulating substantially said scintillator to shield said primary particle beam from the electrical field of said scintillator, comprising:
   (i) a primary beam shielding having a hollow tube-like form, facilitating passing through of said primary particle beam without substantial hindrance or affect from electrical field of said scintillator, said primary beam shielding accommodated within said open area;
   (ii) an electrically conducting box, having an open side from where said detected charged particles enter said box;
   (iii) a protective grid or mesh-sheet covering said open side, electrically connected to said protective sleeve for achieving protection of immediate environment from electrical field of said scintillator anode; and
   (iv) a filter grid or mesh-sheet assembly, accommodated in front of said scintillator, constituting more than one filter grid or mesh-sheet elements, each said filter grid or mesh-sheet elements electrically isolated and biased at a positive or negative electric potential for inducing various interactions between said detected charged particles and said filter assembly, wherein one or more elements of said filter grid or mesh-sheet elements is a MCP.

Furthermore, in accordance with yet another embodiment, there is provided:

a method for detecting charged particles, comprising:
(a) producing photons from detected charged particles that impinge on a scintillator, having an open area substantially replacing a region in said scintillator manifesting low efficiency detection;
(b) transferring said photons to a photon-detection element, having an open area, conform in size and position with said open area of said scintillator;
(c) facilitating passing through of the primary particle beam without substantial hindrance or affect from electrical field of said scintillator; and
(d) inducing at least one out of various interactions between said detected charged particles and said conductive part.

In above-mentioned method, alphabetic characters used to designate steps are provided for convenience only and do not imply any particular order of performing the steps.

As mentioned above, it should be noted that in above discussions the phrase "in-lens detector" is generally applicable to any detector wherein the primary beam passes through or nearby and thus, the above referral to SEM does not limit or confine the present invention in any way. The invention is thus, in general, relevant for any charged particle beam detection apparatus, wherein the detection area embodies an area of low detection efficiency.

BRIEF DESCRIPTION OF THE DRAWINGS

In order to understand the present invention and to see how it may be carried out in practice, these and further constructional features of the present invention will be appreciated in the light of the ensuing description of the preferred embodiment thereof, given by way of non-limiting example only with reference to the accompanying drawings wherein:

FIGS. 3A and 3B are schematic frontal views of a prior art in-lens light guide scintillator detector and the in-lens light guide scintillator detector of the preferred embodiment of the present invention respectively;

DETAILED DESCRIPTION OF A PREFERRED EMBODIMENT

The present invention is described by one embodiment, in reference to a light guide and scintillator, both having an open area and surrounded by an electrically conducting protective sleeve in the form of a box. For convenience of explanation the present invention is furthermore described with reference to an in-lens light guide scintillator detector, constituting a variable electric potential scintillation anode and a set of screening and filter grids and wherein the scintillator region, shadowed by the primary beam shielding, is empty. Thus, both light guide and scintillator have a fork-like shape in the description below. Although specific reference is made to a scintillator detector, in general the present invention is related to charged particle detectors in charged particle beam apparatus, wherein low detection efficiency is observed due to shadowing caused by the primary beam shielding.

It should be noted that the present invention is by no means bound to the specific structure, manner of operation and electric potential charge voltages as described below. In examples described below electric beam transport potential $V_{COLUMN}$ and electric sample potential $V_{SAMPLE}$ are subject to the design of the column.

Figure 2:
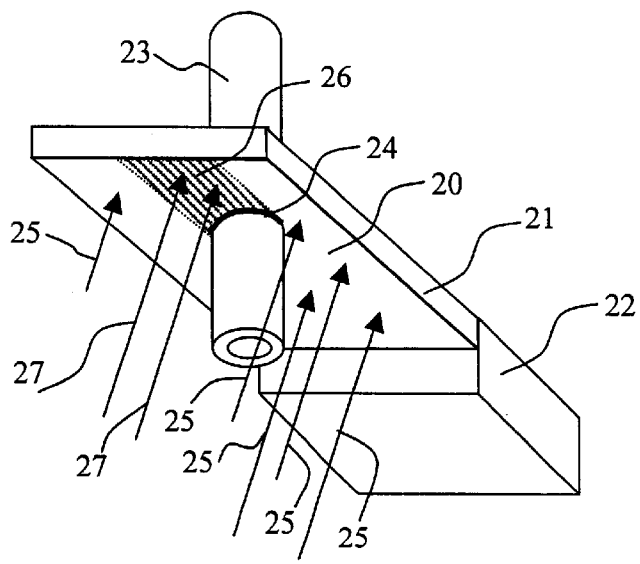
FIG. 2 is a perspective illustration of the scintillator and primary beam shielding of a prior art in-lens light-guide scintillator detector.

FIG. 3A illustrates schematically a front view of a common prior art in-lens light guide scintillator detector as illustrated in perspective in FIG. 2. Scintillator anode and underneath light guide are shown as rectangular shape 30. It is noted here that ordinarily, light guide and scintillator anode have conform shapes, but the present invention is by no means limited to such a particular arrangement. Primary beam shielding 31 protrudes by means of hole 32 through scintillator and light guide 30 thus facilitating passing of the primary beam through hole 32 without substantial hindrance of affect from the electrical field of the scintillator. It should be noted that primary beam shielding 31 induces a "shadow" region 33, part of scintillator anode 30, as the lower detection efficiency of region 33 is commonly known by the person versed in the art. As already mentioned above with reference to FIG. 2, electrons impinging onto the surface within the shadow region of the scintillator, generate photons, which are obstructed from reaching the photon-detection element, commonly a photomultiplier tube (22 in FIG. 2) by means of light guide 34. In accordance with the present invention, the detection efficiency in the "shadow" area 33 is substantially improved by introducing a scintillator 35 (FIG. 3B) wherein the "shadow" area 33 is replaced by an open area 36 wherein at least one conductive part, set at a defined electric potential, is arranged to either directly deflect the incoming electrons from the shadow region or allow these incoming electrons to impinge onto its surface. Electrons striking the surface of the conductive part, preferably coated with a high emissive material, produce secondary electrons, which are subsequently pulled out of the low efficiency detection region and impinge onto the detector in a more detection effective region. Due to open area 36, scintillator rectangle 30 is rendered into a fork-like shaped scintillator 35 with two prongs 37 and 38 protruding from both sides of primary beam shielding 39. Those versed in the art will readily appreciate that fork-like shaped scintillator 35 although having a smaller detection area, does not decrease substantially detection efficiency or substantially decrease the amount of electrons reaching the above mentioned photomultiplier tube, because electrons that would impinge onto the low detection efficiency region would a priori not substantially contribute to the generation of the electric output signal of the detector.

The present invention is not bound in any way to the drawing illustrated in FIG. 3B, which shows a specific primary beam shielding arrangement. It is noted that any detection arrangement wherein a region of low detection efficiency (commonly the shadow region of the primary beam shielding) is replaced by an open area, is embraced by the invention. Furthermore, those versed in the art will appreciate that the present invention can also be advantageously applied in detection arrangements wherein the primary beam passes the light guide and scintillator at close vicinity.

Figure 4:
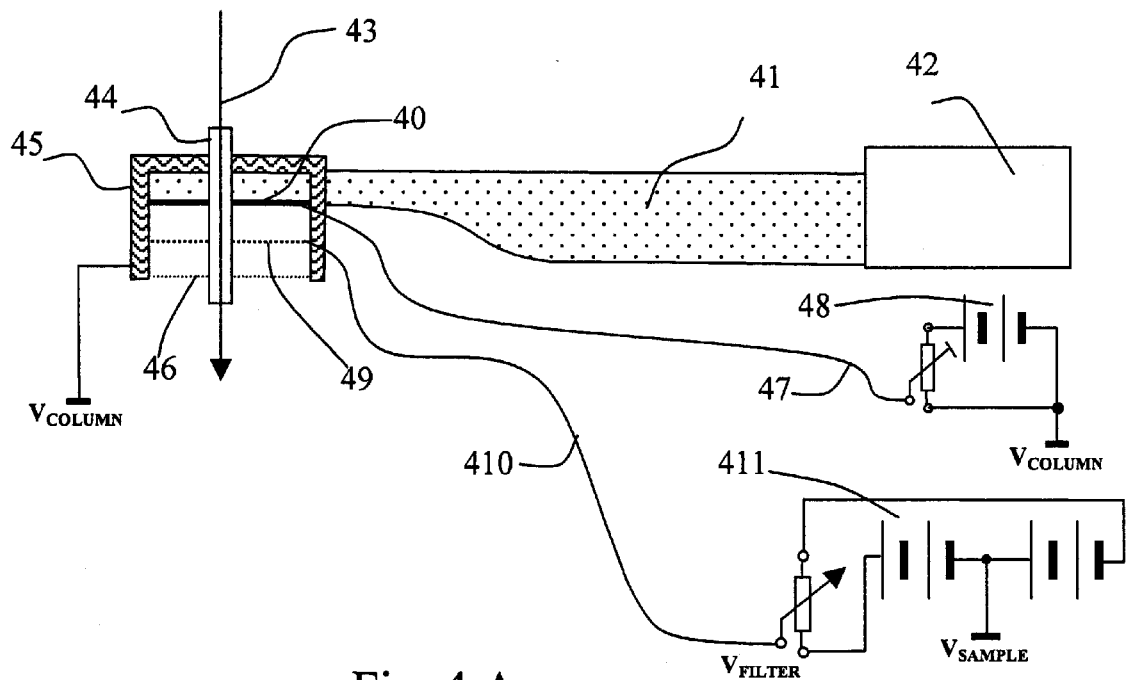
FIGS. 4A, 4B are schematic illustrations of a high efficiency, enhanced detecting, in-lens light guide scintillator detector for SEM, in accordance with one embodiment of the present invention.
FIG. 4C is a perspective illustration of a high efficiency, enhanced detecting in-lens light guide scintillator detector for SEM, in accordance with the embodiment illustrated in FIGS. 4A and 4B.
Figure 4:
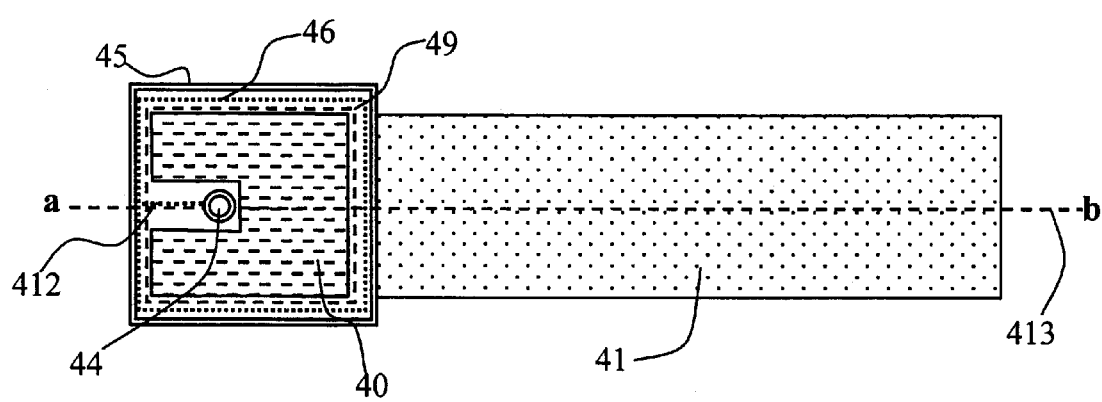
Figure 4:
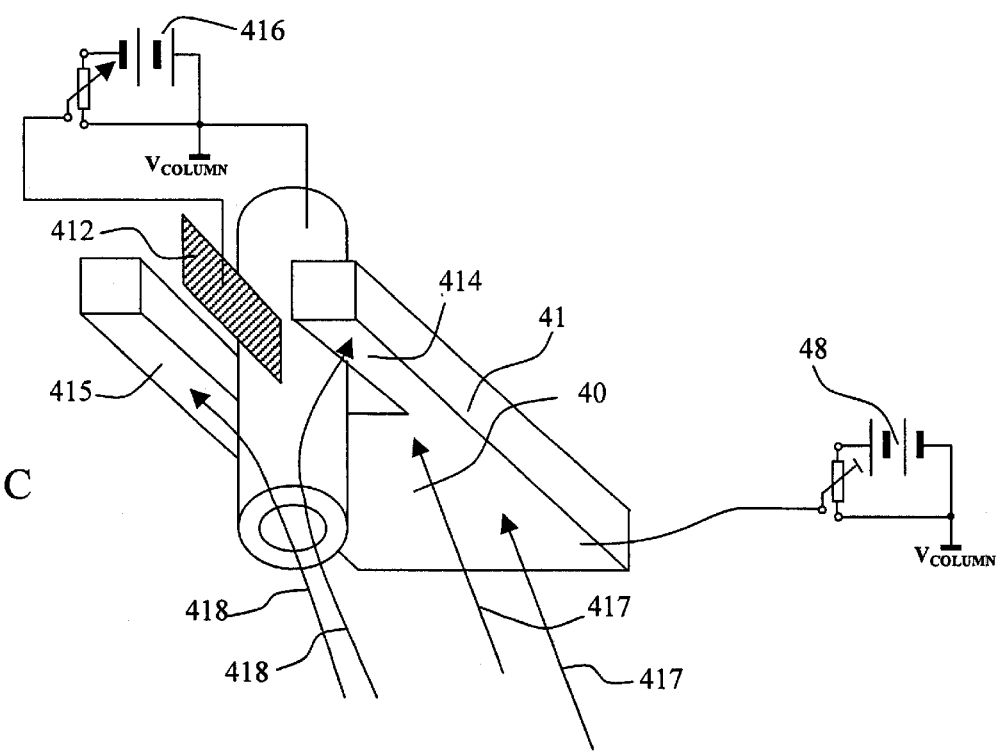

FIG. 4A illustrates the preferred embodiment of the present invention. Scintillator anode 40 is coupled to light guide 41 and includes a scintillating layer, a conductive layer forming the scintillator anode for biasing and an insulating base material. Alternatively, the scintillating and conductive layer can be coated directly on the light guide. Light guide 41 is coupled to photon-detection element (commonly a photomultiplier tube) 42. Primary particle beam 43 passes through the light guide and scintillator by means of primary beam shielding 44, protruding at both opposite sides of protective sleeve 45. Protective sleeve 45 shields primary particle beam 43 from the electrical field of the scintillator anode, which is biased at a positive electric potential of several kV's above the electric potential of protective sleeve 45 and primary beam shielding 44, both at beam electric potential $V_{COLUMN}$.

In the preferred embodiment, protective sleeve 45 is a box closed at all sides, except for the side from where the incoming electrons enter the protective sleeve 45. This side is covered by a protective grid or mesh-sheet 46, thus enabling passing of incoming electrons, whilst shielding or protecting the immediate environment from the electrical field of the scintillator anode or filter grid 49. Protective grid or mesh-sheet 46 is in the preferred embodiment electrically connected to protective sleeve 45 and thus at beam electric potential $V_{COLUMN}$.

In another embodiment, protective grid or mesh-sheet 46 is electrically isolated from protective sleeve 45 and connected to a D.C. power supply (not depicted) to bias protective grid or mesh-sheet 46 at various defined positive or negative electric potentials to achieve various interactions between incoming electrons and protective grid or mesh-sheet 46, such as inter alia, further enhancement of electron yield and additional control (such as energy filtering) over incoming electrons and/or SE's, emanating from the sample. It should be noted that in order not to induce electrical fields that conceivably influence negatively primary beam properties, it is preferred to limit biasing protective grid or mesh-sheet 46 only to several volts in relation to beam electric potential $V_{COLUMN}$.

Electric conductive wire 47 connects scintillator anode electrically with D.C. power supply 48 to bias scintillator anode at a defined positive electric potential.

In the preferred embodiment, there is further provided a filter grid or mesh-sheet 49 inside protective sleeve 45 that by means of electric conductive wire 410 is biased at a defined negative or positive (relative to $V_{SAMPLE}$) electric potential by D.C. power supply 411 to achieve defined interactions with incoming electrons, explained in more detail below. Furthermore, there is provided for a conductive grid or foil 412, accommodated in the open area of fork-like shaped light guide 41. This conductive grid or foil 412 can also be set at defined various electric potentials for inducing desired interactions discussed in detail below.

FIG. 4B is a frontal schematic view of the detector of the preferred embodiment as shown in FIG. 4A. This frontal view shows the side of protective sleeve 45 that is covered by protective grid or mesh-sheet 46, allowing incoming electrons to impinge on scintillator 40. Dotted line 'ab' 413 shows for reference the position of side view shown in FIG. 4A. The frontal view of FIG. 4B facilitates the viewing of the light guide and scintillator having fork-like shapes. It should be noted here, that scintillator anode 40, coupled to one end of light guide 41, has also a fork-like shape, conform to the shape of light guide 41. For reasons of clarity, in FIG. 4B photomultiplier tube 42 (FIG. 4A) has been omitted. In front of scintillator anode 40 is in the preferred embodiment filter grid 49, having a rectangular shape, conform the shape of protective sleeve 45. Biasing filter grid or mesh-sheet 49 at defined, various electric potentials, lower than sample electric potential $V_{SAMPLE}$, will effectively inhibit electrons with less kinetic energy than the biasing electric potential of filter grid 49, from impingement on scintillator anode 40, thus inducing high-pass energy filtering of incoming electrons, discussed in more detail below.

For same reason of clarity, filter grid or mesh-sheet 49 and protective grid or mesh-sheet 46, shown in FIG. 4A, are only indicated by dotted lines in FIG. 4B. In another embodiment, filter grid 49 constitutes a filter assembly of more than one (not depicted) grids positioned between scintillator anode 40 and protective grid or mesh-sheet 46. Biasing each grid of the filter assembly at a defined electric potential achieves a multitude of additional enhancements and control possibilities, such as inter alia, energy filtering.

It should be noted here that configurations of protective grid or mesh-sheet 46 with filter grid or mesh-sheet 49 may vary depending upon various design considerations. Thus, for example, one configuration is the usage of a protective grid or mesh-sheet 46 without a filter grid or mesh-sheet 49, which, when the protective grid or mesh-sheet 46 is electrically isolated and biased at a positive or negative electric potential, enables various interactions between incoming charged particles and the protective grid or mesh-sheet 46, hence performing the energy filtering of the filter grid or mesh-sheet 49, not utilized in this embodiment.

FIG. 4C is a sideways perspective view of the detector of the preferred embodiment of the present invention. For reasons of clarity, shield 45, protective grid or mesh-sheet 46, filter grid or mesh-sheet 49 and photomultiplier tube 42 (FIGS. 4A and 4B) have been omitted to facilitate the viewing of the fork-like shaped light guide 41, fork-like shaped scintillator anode 40 and conductive grid or foil 412 in a perspective manner. Conductive grid or foil 412 is disposed in a vertical manner (perpendicular to light guide and scintillator) in the open area between the two prongs 414 and 415 of fork-like shaped light guide 41. Grid 412 is typically biased by D.C. power supply 416 at an electric potential lower than scintillator anode 40, and preferably, biased at a lower electric potential than $V_{SAMPLE}$ electric potential, thus deflecting substantially, all electrons emanating from the sample, away from the open area. Scintillator anode 40 is coated with a conducting material and biased at a positive electric potential by a D.C. power supply 48, thus attracting incoming electrons 418. In this embodiment, incoming electrons 417 approaching conductive grid or foil 412 are deflected by grid 412 if held at a determined negative electric potential and attracted by the accelerating electric field of the scintillator anode, prevalently biased at an electric potential of several kV's. If grid 412 is held at $V_{COLUMN}$, incoming electrons 417 are only attracted by the accelerating electric field of the scintillator anode. It is noted that D.C. power supply 416 can influence significantly the path of incoming electrons, either passively (when grid 412 is held at $V_{COLUMN}$) or actively (when grid 412 is held at a negative electric potential). Thus electrons directed towards scintillator anode 40 will impinge on the scintillator anode 40 and thus contribute to the generation of the image, independently of where they hit the detector. It should be noted that the freedom to choose the impact energy of electrons on the scintillation material independent of the beam energy is significantly responsible for improved efficiency.

The introduction of the open area 36 (FIG. 3B) has thus substantially eliminated the low efficiency region ("shadow" area) of scintillator anode 40. Accordingly, the specified shadowing effect is substantially reduced.

Figure 5:
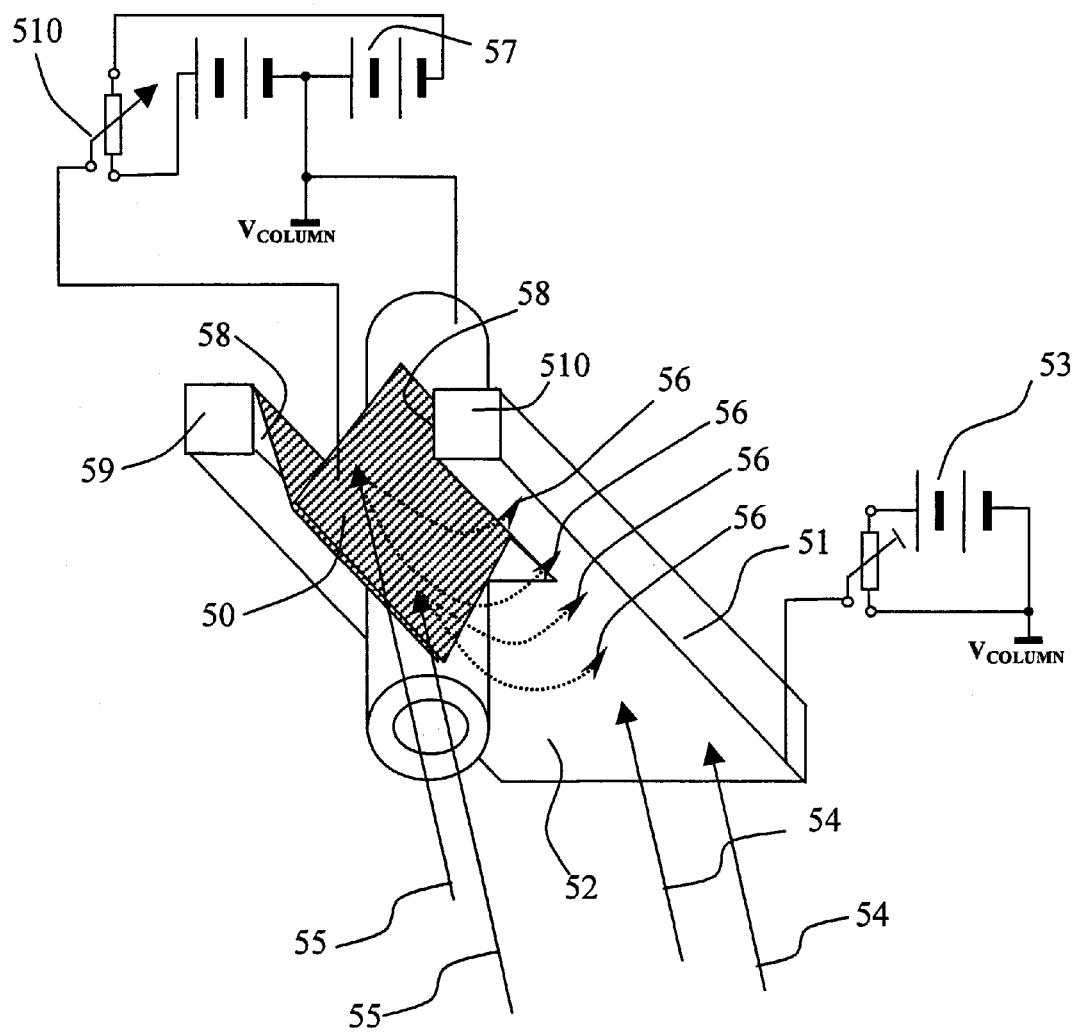
FIG. 5 is a perspective illustration of a high efficiency, enhanced detecting in-lens light guide scintillator detector for SEM, in accordance with another embodiment of the present invention.

In FIG. 5 another embodiment is schematically shown, also in perspective sideways view, wherein the conductive grid or foil 50 (412 in FIG. 4C) has a tent-like shape, substantially covering the open area between the prongs of fork-like shaped light guide 51. Scintillator 52 is coated with a conducting material and biased at a positive electric potential of several kV's by a D.C. power supply 53, thus attracting incoming electrons 54. If conductive grid or foil 50 is at beam electric potential $V_{COLUMN}$ as in above-mentioned embodiment (with reference to FIG. 4C), conductive grid or foil 50 will function in a similar manner as in above-mentioned embodiment, thus deflecting incoming electrons 55 towards scintillator 52. It should be mentioned that not all incoming electrons 55 will be sufficiently deflected in order to impinge on scintillator 52, but a certain percentage of these high kinetic energy incoming electrons will only slightly change their path and would not be detected if a vertical grid as described above 412 (FIG. 4C) would have been deployed. Thus, a tent-like shaped foil, covering substantially the open area will not only deflect electrons to the high efficiency area of scintillator 52, but also in addition achieve impingement on foil 50 of those high kinetic energy incoming electrons, not being sufficiently deflected. The compounded result is a substantial increase of electron detection. Tent-like shaped foil 50 which may have a coating from a choice of suitable high emissive materials thus providing the means to generate one or more SE's 56 emanating from each impinging incoming electron on tent-like shaped foil 50, increasing electron yield even more. The positive electric potential of the scintillator anode will consecutively accelerate the SE's to the scintillator anode.

In another embodiment, foil is biased at a positive or negative electric potential, varying from preferably several tens to a few hundred Volts by D.C. power supply 57. Foil 50 has a surface from a choice of suitable highly emissive coatings. Electrons 55 directed towards scintillator anode 52 are accelerated towards foil 50 if a positive electric potential is applied to the foil and thus electrons impinge on the emissive coating of foil 50. In addition, also a substantive percentage of electrons 54 will now be deflected towards foil 50 as well. For each impinging electron 55 and 54 onto foil 50, one or more SE's 56 are generated. Thus, a first stage of amplification has been accomplished, contributing to further increase of light output in addition to above mentioned advantages of high efficiency and substantial uniform detection. It should be noted that in this embodiment the sides 58 of the two prongs 59 and 510 (414 and 415 in FIG. 4C), facing foil 50, feature also scintillators or are also coated with scintillator material and thus SE's impinging onto these sides will also generate photons, increasing further the electron yield or detection efficiency. By attenuating bias potential of foil 50 by means of potentiometer 510 at a negative electric potential lower than scintillator anode 52, foil 50 functions similar to above-mentioned conductive grid or foil 412 (FIG. 4C). By lowering bias potential of foil 50 further until bias potential is lower than $V_{SAMPLE}$ electric potential, a variable energy filtering scheme is achieved. Those versed in the art will readily appreciate that foil 50, set at various potentials can thus effect the impingement onto foil 50 of low kinetic energy incoming electrons from attracting up and till deflecting.

Figure 6:
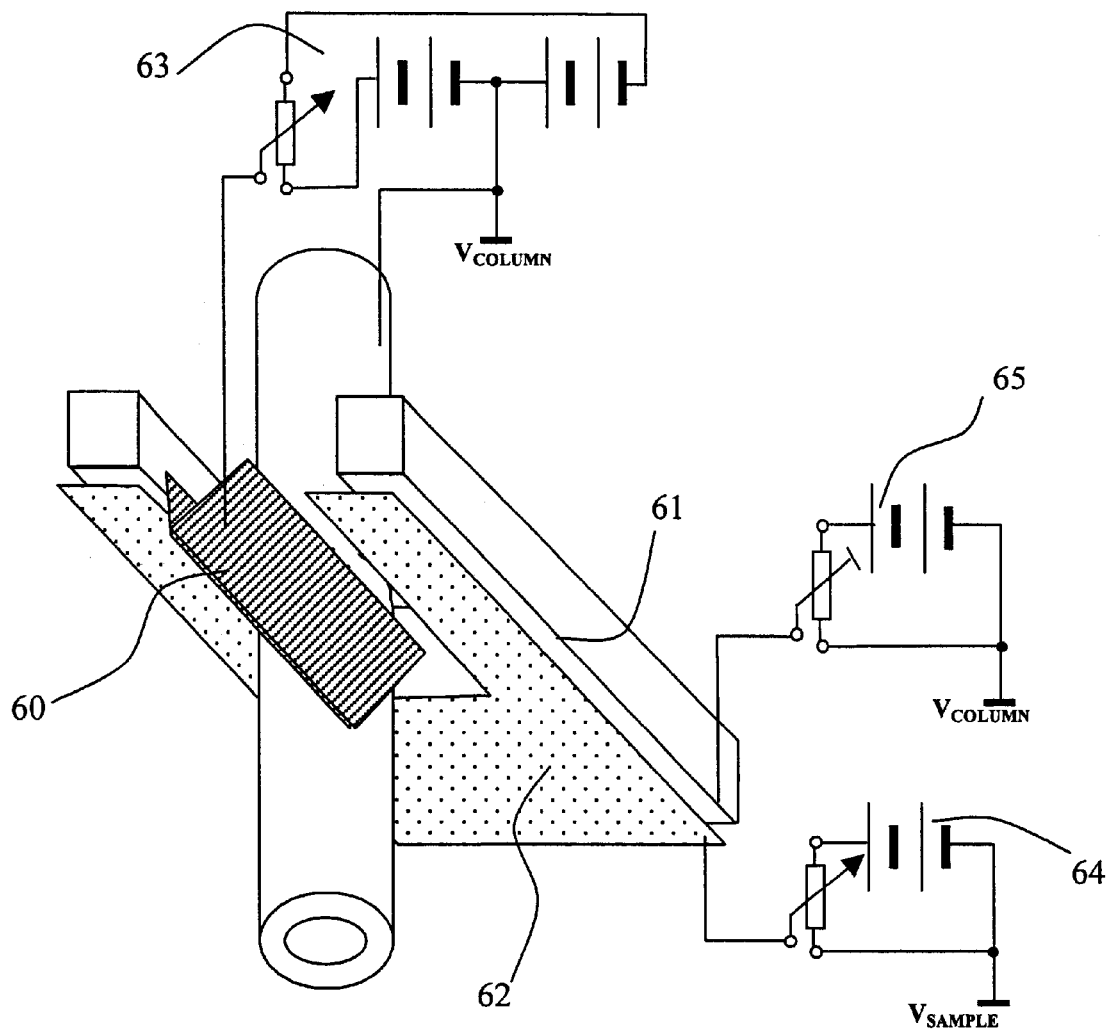
FIG. 6 is a perspective illustration of a high efficiency, enhanced detecting in-lens light guide scintillator detector for SEM, in accordance with yet another embodiment of the present invention.

In FIG. 6, another embodiment is schematically shown, also in perspective sideways view, wherein tent-like shape 60 is disposed at an elevated position relative to scintillator anode 61, thus facilitating the insertion of filter grid or mesh-sheet 62 (49 in FIGS. 4A and 4B) parallel to the surface of scintillator anode 61, and geometrically positioned between tent-like shape 60 and scintillator anode 61. Tent-like shape 60 is biased at a positive electric potential above beam electric potential $V_{COLUMN}$ by means of D.C. power supply 63, attracting incoming electrons, which impinge on the tent-like shape 60 and SE's will thus emanate from shape 60 having optionally, a surface having a coating from a choice of suitable highly emissive materials. Filter grid or mesh-sheet 62 is biased at a positive electric potential between tens and e.g. a few hundred Volts above sample electric potential $V_{SAMPLE}$ by means of D.C. power supply 64, thus attracting SE's toward scintillator anode 61, biased at a higher electric potential than filter grid or mesh-sheet 62 by means of D.C. power supply 65. By biasing filter grid or mesh-sheet 62 at an electric potential that is lower than sample electric potential $V_{SAMPLE}$, attenuation or filtering can be optionally achieved.

In other embodiments, protective grid or mesh-sheet 46 (FIG. 4) and/or filter grid or mesh-sheet 62 are filter grid or mesh-sheet assemblies are constructed of more than one (not depicted) grids, each grid optionally biased at a defined, distinct electric potential for inducing a multitude of additional enhancements and filter-control possibilities.

In other embodiments, part of the above-mentioned filter grid or mesh-sheet assembly 46 and/or filter grid or mesh-sheet assembly 62 constitutes a single or double Micro Channel Plate (MCP). Customary, MCP's enable applying an accelerating electric potential across the ends of the device, thus the energy filtering functionality of grid or mesh-sheet 62 is preserved in addition to substantial increase of electron yield, inherent to customary MCP's.

Figure 7:
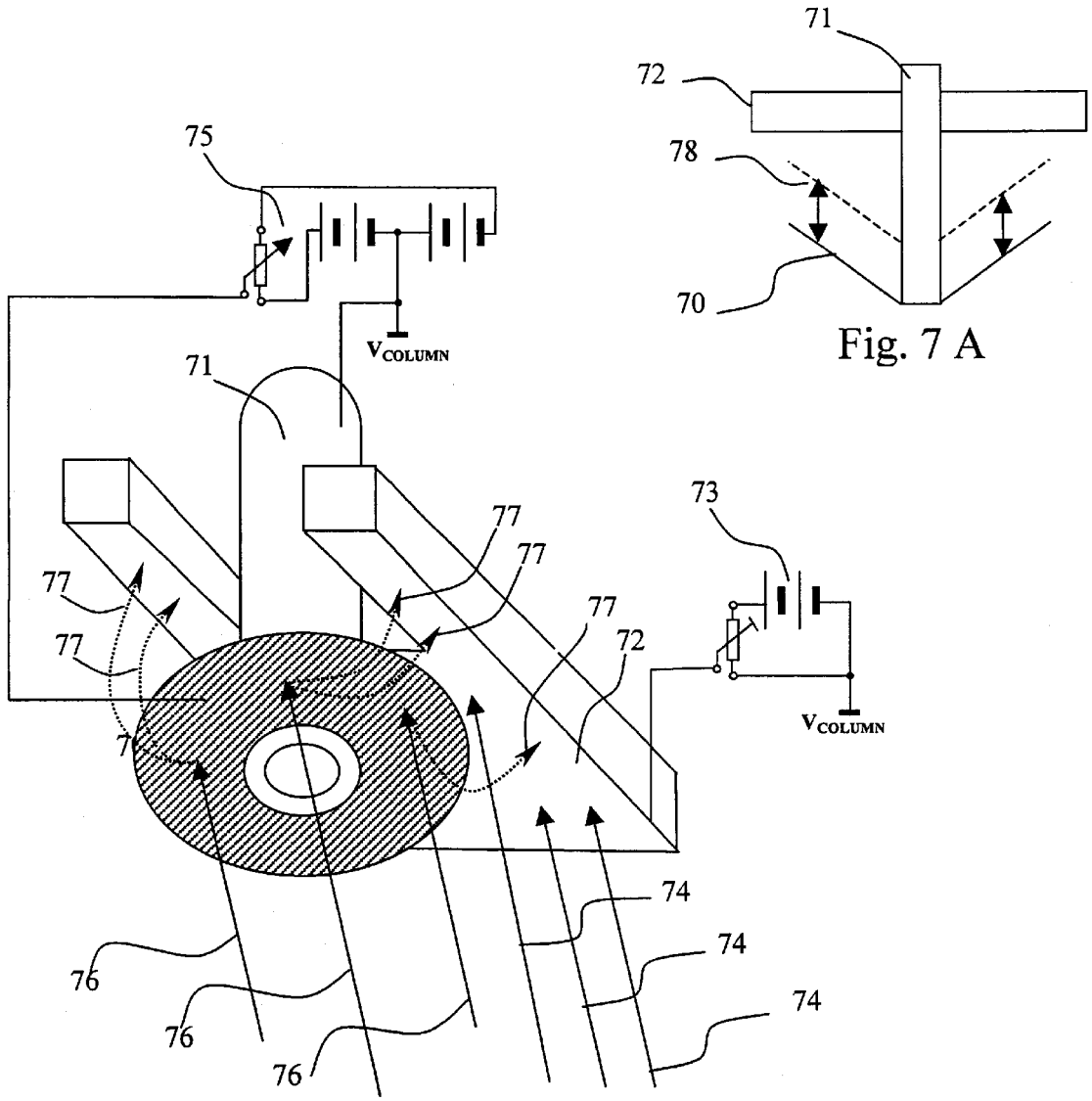
FIG. 7A is a perspective illustration of a high efficiency, enhanced detecting in-lens light guide scintillator detector for SEM, in accordance with still yet another embodiment of the present invention.
FIG. 7B is a schematic sideways view of the primary beam shielding in accordance with the embodiment as depicted in FIG. 7A.

In FIG. 7A another embodiment is schematically shown, wherein conductive grid or foil 70 (60 in FIG. 6 and 50 in FIG. 5) is formed in the shape of a truncated cone of a hollow cylindrical projection at one end, this end disposed at the end of the primary beam shielding 71 where the primary beam exits. In FIG. 7B scintillator anode 72 is biased at a positive electric potential of several kV's by D.C. power supply 73, thus attracting incoming electrons 74. Cone 70 has optionally, a surface from a choice of suitable highly emissive coatings. Similar to the previous embodiment, electrons are deflected and accelerated towards cone 70 by means of a positive electric potential applied to cone 70 varying from several tens to a few hundred Volts by D.C. power supply 75 and therefore, electrons 76 impinge on the emissive coating of the cone and for each impinging electron one or more SE's 77 are generated. These SE's 77 are thereupon accelerated by the electric field of the scintillator anode, in a similar manner as above mentioned electrons 74, thus contributing to increase of light output in addition to above mentioned advantages of high efficiency and enhanced detection. In addition, the elevated position of cone 70 facilitates the insertion (not depicted) of a filter grid, filter grid assembly, MCP or a combination of filter grid(s) and one or more MCP's (62 in FIG. 6) in a similar manner as described above.

In another embodiment, cone 70 is disposed at a pre determined position 78 between the end of the primary beam shielding 71 where the primary beam exits and the surface of scintillator anode 72.

Reverting to FIG. 6, it is noted that usage of filter grid, filter grid assembly, MCP or a combination of grid(s) and one or more MCP's 62 (49 in FIG. 4A) in above-mentioned embodiments is not limited to fork-like shaped scintillators and light guides. Thus, in another embodiment, a scintillator and associated light guide, embodying a shape other than above-mentioned fork-like shape, there is provided a filter grid, filter grid assembly, MCP or a combination of filter grid(s) and one or more MCP's 49 inside protective sleeve 45 (FIG. 4A).

There follows now a brief discussion related to potential damage and/or non-linear response of a detector due to a high density, low profile detected beam impinging onto the detector.

Figure 1:
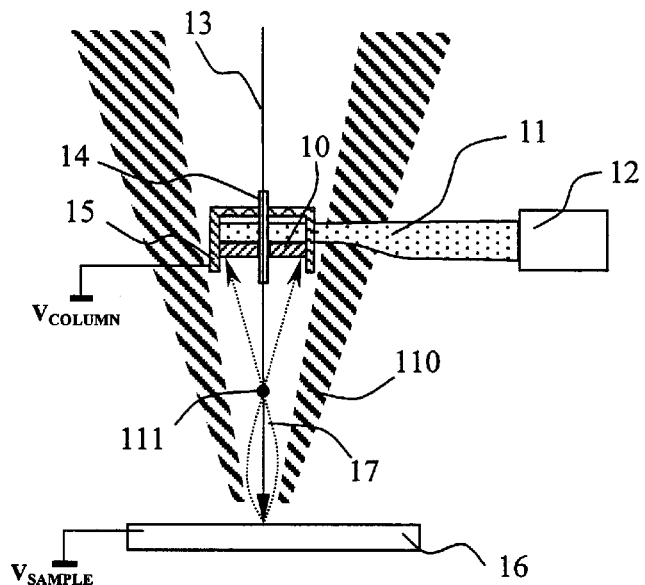
FIG. 1 is a schematic illustration of a prior art in-lens light guide scintillator detection arrangement utilizing a detector objective.

This embodiment enables detection of high density, low-profile detected beams without problems of possible damage to the scintillator and/or unwanted local or overall scintillator saturation causing local or overall non-linear scintillator response. A high density detected beam situation is under certain conditions induced when the scintillator needs to be positioned at or very near a crossover point of a returning or detected beam. Objective lens parameters, physical and Electro-optical restraints necessitate or limit in certain SEM column arrangements the placement of a electron detector at or very near to a crossover point 111 (FIG. 1) of the returning or detected beam. Because the detected beam has inherently a very small diameter (or low profile) at crossover point 111 (FIG. 1), the density of electrons at such a crossover point is therefore very substantial. Some scintillators exhibit non-adiabatic transformation properties of electrons into photons at substantial high incoming electron densities. The thus generated thermal energy is sufficient to deform, burn or change irreversible the scintillator. It should be noted that even at lower densities scintillator saturation can occur. When the response curve of a detector exhibits a decrease in slope that from a certain input level on is parallel to the input axis, the detector is said to be saturated. Increase of input will not lead to an increase of output and dependent upon the detection device, the high input energy can cause damage to the detector. For electron scintillator detectors in particular, more impinging electrons will not produce more photons by virtue of the maximum amount of photons the scintillator is capable of producing has been reached. The kinetic energy of the impinging electrons not transformed into photons is substantially transformed into thermal energy that cannot be dissipated sufficiently fast and thus the local temperature of the scintillator will rise significantly. The result is a non-linear response of the scintillator, having as consequence substantial image quality deterioration caused by contrast distortion or unwanted contrast compression. Moreover, not dissipated thermal energy induces ordinarily physical or structural irreversible damage to the scintillator. To minimize or avoid entirely saturation or even non-reversible damage in high density detected beam situations, the high density detected beam is preferably targeted by known per se means at cone 70 (FIG. 7), aiming detected electrons slightly off-axis so that the detected electrons impinge only on cone 70 (FIG. 7) and produce SE's 77 (FIG. 7), having inherently lower energies. These electrons are then accelerated toward scintillator area 73 (FIG. 7) and will in fact spread over a large region effectively averaging the response of the entire scintillator area and thus in addition, lowering substantially the density of the detected beam.

There follows now a brief discussion of the above-mentioned energy filtering.

It should be noted that in the above mentioned embodiments the present invention has been utilized to amplify or enhance the detection of incoming electrons either by deflection or/and attracting incoming electrons. By applying an electric potential charge $V_{FILTER}$ to filter grid 49 (FIG. 4A) by means of electric conductive wire 410 (FIG. 4A) biased at defined electric potential by D.C. power supply 411 (FIG. 4A) that is below the sample electric potential $V_{SAMPLE}$, an energy filtering is achieved as only incoming electrons having an energy level above $V_{VAR}$ will be capable of reaching the scintillator area. For example, setting $V_{FILTER}$ at 50 eV below sample electric potential $V_{SAMPLE}$, substantially only BSE's will generate the signal of the SEM image and SE's, having an energy level well below 50 eV, are filtered out, thus effectively inhibiting them from contributing to the generation of the image signal of the SEM. By setting $V_{FILTER}$ at various voltages, energy filtering in many regions can be accomplished. As known per se, electrostatic lenses accelerate SE's released from a sample towards the electron detector through increasing their kinetic energies by several thousand electron volts so that by the time they reach the electron detector they behave as if there were BSE's. Thus, it is of importance to enable energy filtering in various regions to separate the various electrons possessing different kinetic energy. This is of importance as (genuine) BSE's are utilized to generate images differentiating regions of the sample with distinct composition.

As has been mentioned above, the present invention is by no means bound to the specified electric potential charge voltages mentioned in above discussions. Furthermore the present invention is not bound nor limited by any means to the specific embodiments and manner of operations mentioned in above discussions, and is generally applicable to any charged particle beam detection apparatus wherein a primary particle beam passes through a detector.

In accordance with the embodiments, the foregoing discussions have shown improvements including the following:

1. Utilizing a fork-like shaped scintillator and a fork-like shaped light guide and optionally, to accommodate a grid or foil in the open area between the two prongs achieves deflection of detected particles from the low efficiency region or "shadow" area to a more detection effective region, so that substantially all generated photons contribute to the generation of the electric output signal of the detector;
2. Utilizing of a grid, foil, tent-like shape, cone, MCP, or a combination of these, accommodated in, above, or in the vicinity of the open area of the fork-like shaped light guide enhances efficiency such as inter alia, amplification or energy boosting of detected particles, independently of original particle energy, by means of applying appropriate electric potential to one or more grid, foil, tent-like shape, cone, or MCP;
3. Energy filtering is achieved by applying defined, electric potential(s) to a grid, assembly of grids, MCP, or a combination of these in front of the scintillator constituting a variable and highly versatile, tunable high-pass filter so that substantially only particles with higher kinetic will contribute to the electric output signal of the detector;
4. First stage amplification by combining a MCP with the above-mentioned grids; and
5. Aiming a high density, low profile detected beam at the conductive foil and not directly at the scintillator, non-linear detector response or possible non-reversible damage to the scintillator is effectively avoided as follows:
   i transforming high kinetic energy particles into a multitude of low kinetic energy electrons; and
   ii spreading said multitude of low kinetic energy electrons over an area of the scintillator which is substantially larger than the impingement area of high kinetic energy particles.

Thus, a high efficiency, enhanced detecting in-lens light guide scintillator detector has been obtained. These enhancements contribute toward enhancement and uniformity in detection of detected charged particles and alleviate some deficiencies inherent to in-lens scintillator detection schemes.

In the method claims that follow, alphabetic characters used to designate claim steps are provided for convenience only and do not imply any particular order of performing the steps.

The present invention has been described with certain degree of particularity. Those versed in the art will readily appreciate that various modifications and alterations may be carried out without departing from the scope of the following claims.

What is claimed is:

1. A charged particle detector, comprising:
   (a) a photon-detection element;
   (b) a scintillator for producing photons from charged particles that impinge on said scintillator, the scintillator having an open area, substantially replacing a region in said scintillator manifesting low efficiency detection;
   (c) a light guide associated with said scintillator for transferring said photons to said photo-detection element, said light guide having an open area, substantially conforming in size and position with said open area of said scintillator;
   (d) a primary beam shielding facilitating passing through of a primary particle beam without substantial hindrance or affect from an electrical field of said scintillator, said primary beam shielding being disposed near said open area; and
   (e) a conductive part, maintained at a predetermined electric potential, accommodated within said open area of said light guide, and disposed to interact with the charged particles that are directed to impinge upon the open area.

2. The detector in accordance with claim 1, for use with a Scanning Electron Microscope (SEM).

3. The detector in accordance with claim 1, further comprising a protective sleeve adapted to shield said primary particle beam from the electrical field of said scintillator.

4. The detector in accordance with claim 3, wherein said protective sleeve substantially encapsulates said scintillator to shield said primary particle beam from the electrical field of said scintillator, said protective sleeve comprising:
   an electrically conducting box, having an open side through which said charged particles enter said box; and
   a protective grid covering said open side;
   wherein said primary beam shielding protrudes at opposite sides of said protective sleeve.

5. The detector in accordance with claim 4, wherein said protective grid is electrically isolated from said electrically conducting box and is biased at a defined positive or negative electric potential.

6. The detector in accordance with claim 5, wherein said defined electric potential is at a lower electric potential than an electric potential of a sample on which the primary particle beam impinges to produce the charged particles.

7. The detector in accordance with claim 5, wherein said protective grid is a single or double Micro Channel Plate.

8. The detector in accordance with claim 5, wherein said protective grid is an assembly constituting more than one grid element, wherein each said grid element is electrically isolated from said electrically conducting box and is biased at a positive or negative electric potential.

9. The detector in accordance with claim 8, wherein said assembly comprises one or more Micro Channel Plates.

10. The detector in accordance with claim 4, further comprising a filter grid that is: electrically isolated from said electrically conducting box, disposed between said scintillator and said protective grid, and biased at a defined electric potential.

11. The detector in accordance with claim 10, wherein said defined electric potential is at a lower electric potential than an electric potential of a sample on which the primary particle beam impinges to produce the charged particles.

12. The detector in accordance with claim 10, wherein said filter grid is a single or double Micro Channel Plate.

13. The detector in accordance with claim 10, wherein said filter grid is a filter assembly constituting more than one grid element, wherein each said filter element is electrically isolated from said protective sleeve and is biased at a defined positive or negative electric potential.

14. The detector in accordance with claim 10, wherein said light guide has a fork-like shaped part that conforms with a fork-like shape of said scintillator which is coupled to said light guide; wherein said conductive part is disposed between said filter grid and said protective grid.

15. The detector in accordance with claim 14, wherein said conductive part is a conductive foil.

16. The detector in accordance with claim 15, wherein said conductive foil is coated with an emissive material capable of producing secondary electrons in response to interactions between said conductive foil and said charged particles.

17. The detector in accordance with claim 15, wherein said conductive foil has a tent-like shape.

18. The detector in accordance with claim 15, wherein said tent-like shape is a truncated cone having a hollow cylindrical projection.

19. The detector in accordance with claim 18, further comprising a device for deflecting and focusing said charged particle onto said truncated cone having a hollow cylindrical projection to produce unfocused, low kinetic energy charged particles and to spread said unfocused, low kinetic energy charged particles over a region of said scintillator.

20. The detector in accordance with claim 14, wherein said conductive foil is situated at a predetermined position between an end of said primary beam shielding where said primary beam exits and a surface of said scintillator anode.

21. The detector in accordance with claim 20, further comprising a device for deflecting and focusing said charged particle onto said truncated cone having a hollow cylindrical projection to produce unfocused, low kinetic energy charged particles and to spread said unfocused, low kinetic energy charged particles over a region of said scintillator.

22. The detector in accordance with claim 14, wherein said conductive foil is disposed at an end of said primary beam shielding where said primary beam exits.

23. The detector in accordance with claim 22, further comprising a device for deflecting and focusing said charged particle onto said truncated cone having a hollow cylindrical projection to produce unfocused, low kinetic energy charged particles and to spread said unfocused, low kinetic energy charged particles over a region of said scintillator.

24. The detector in accordance with claim 1, wherein said primary beam shielding has a hollow tube-like form.

25. The detector in accordance with claim 1, wherein said scintillator and said light guide have a hole through which said primary beam shielding protrudes.

26. The detector in accordance with claim 1, wherein said open area is smaller in size than said region of low efficiency detection.

27. The detector in accordance with claim 1, wherein said open area is equal in size of said region of low efficiency detection.

28. The detector in accordance with claim 1, wherein said open area is larger in size than said region of low efficiency detection.

29. The detector in accordance with claim 1, wherein said scintillator is disposed at one end of said light guide.

30. The detector in accordance with claim 1, wherein said light guide scintillator detector is an in-lens light guide scintillator detector.

31. The detector in accordance with claim 1, wherein said primary particle beam passes through said detector.

32. The detector in accordance with claim 1, wherein said primary particle beam passes close to, but not through, said detector.

33. The detector in accordance with claim 1, wherein said scintillator comprises:

(a) an insulating base material;

(b) a conductive layer disposed on said insulating base material, said conductive layer constituting a scintillator anode adapted to have a bias electric potential applied thereto; and (c) a scintillating layer or element, disposed to or forced onto or under said conductive layer, or disposed between said conductive layer and said insulating base material.

34. The detector in accordance with claim 1, wherein said light guide serves as an insulating base and wherein said scintillator comprises:

(a) a conductive layer disposed on said light guide, said conductive layer constituting a scintillator anode adapted to have a bias electric potential applied thereto; and (b) a scintillating layer or element, disposed to or forced onto or under said conductive layer, or disposed between said conductive layer and said light guide.

35. The detector in accordance with claim 1, wherein said light guide has a fork-like shaped part that conforms with a fork-like shape of said scintillator which is coupled to said light guide; said conductive part is accommodated in said open area between prongs of said fork-like shaped part.

36. The detector in accordance with claim 35, wherein said conductive part is a grid.

37. The detector in accordance with claim 35, wherein said conductive part has a planar shape, and is disposed substantially perpendicular to said scintillator.

38. The detector in accordance with claim 37, wherein said conductive part is biased at a transport electric potential of the primary particle beam.

39. The detector in accordance with claim 35, wherein said conductive part is a conductive foil.

40. The detector in accordance with claim 39, wherein said conductive foil is coated with an emissive material capable of producing secondary electrons in response to interactions between said conductive foil and said charged particles.

41. The detector in accordance with claim 40, wherein said conductive foil has a tent-like shape, and is disposed substantially to cover said open area between said prongs.

42. The detector in accordance with claim 41, wherein said tent-like shape is a truncated cone having a hollow cylindrical projection.

43. The detector in accordance with claim 41, wherein additional scintillators are disposed on the sides of said prongs of said fork-like shaped part substantially facing said conductive foil.

44. A charged particle detector, for use with a Scanning Electron Microscope (SEM) comprising:

(a) a photo-detection element;
(b) a scintillator for producing photons from detected charged particles that impinge on said scintillator, the scintillator having an open area substantially equal in size and position of a region of low efficiency detection, comprising:
   (i) an insulating base material;
   (ii) a conductive layer disposed on said insulating base material, said conductive layer constituting a scintillator anode adapted to have a bias electric potential applied thereto; and
   (iii) a scintillating layer or element, disposed to or forced onto or under said conductive layer, or disposed between said conductive layer and said insulating base material;
(c) a light guide associated with said scintillator at one end of said light guide for transferring said photons to said photon-detection element at an other end of said light guide, said light guide having an open area conforming in size and position with said open area of said scintillator;
(d) a protective sleeve that substantially encapsulates said scintillator to shield a primary particle beam from an electrical field of said scintillator, comprising:
   (i) a primary beam shielding having a hollow tube-like form facilitating passing through of said primary particle beam without substantial hindrance or affect from the electrical field of said scintillator, said primary beam shielding being disposed within said open area;
   (ii) an electrically conducting box, having an open side where said charged particles enter said box;
   (iii) a protective grid covering said open side, electrically connected to said electrically conducting box; and
   (iv) a filter grid assembly, disposed in front of said scintillator, and constituting one or more filter grid elements, each of said filter grid elements being electrically isolated from said electrically conducting box and biased at a positive or negative electric potential, wherein one or more elements of said filter grid is a Micro Channel Plate; and
(e) a conductive part, maintained at a predetermined electric potential, accommodated within said open area of said light guide, and disposed to interact with charged particles that impinge upon the open area.

45. A method for detecting charged particles, comprising:
(a) producing photons from charged particles that impinge on a scintillator, the scintillator having an open area substantially replacing a region in said scintillator manifesting low efficiency detection;
(b) transferring said photons to a photon-detection element, wherein the step of transferring utilizes a light guide having an open area substantially conforming in size and position with said open area of said scintillator;
(c) facilitating passing through of a primary particle beam without substantial hindrance or affect from an electrical field of said scintillator; and
(d) disposing a conductive part and maintaining it at a predetermined potential so as to induce interactions between charged particles that are directed to impinge upon the open area and said conductive part.

46. The method in accordance with claim 45, for use with a Scanning Electron Microscope (SEM).

47. The method in accordance with claim 45, wherein said conductive part is a conductive foil that is coated with an emissive material, further comprising a step of: biasing said conductive part at a potential higher than a scintillator electric potential.

48. The method in accordance with claim 47, wherein said conductive foil includes one or more grids or/and foils, one or more grids and/or foils having a tent-like shape, one or more grids and/or foils have a shape of a cone, a micro channel plate, or a combination thereof.

49. The method in accordance with claim 45, further comprising steps of:
(a) utilizing a protective sleeve substantially encapsulating the scintillator to shield the primary beam from the electric field of said scintillator; wherein the protective sleeve has an open side through which said charged particles enter said protective sleeve;
(b) utilizing a protective grid covering said open side of said protective sleeve; and
(c) applying a predetermined potential to the protective sleeve.

50. The method in accordance with claim 49, further comprising the steps of:
(a) utilizing a filter grid accommodated between said scintillator and said protective grid; and
(b) biasing said filter grid at a defined electric potential.

51. The method in accordance with claim 50, wherein said defined electric potential is at a lower electrical potential than an electric potential of a sample on which the primary particle beam impinges to produce the charged particles.

52. The method in accordance with claim 47, further comprising steps of:
(a) deflecting said charged particles onto said conductive foil;
(b) focusing the deflected charged particles onto said conductive foil;
(c) transforming charged particles having high kinetic energy into a multitude of low kinetic energy electrons; and
(d) spreading said multitude of low kinetic energy electrons over an area of said scintillator being substantially larger than the impingement area of detected charged particles having high kinetic energy.

53. A charged particle detector that comprises:
a photon detector;
a scintillator detector that produces photons when charged particles impinge thereon;
a light guide disposed to guide the photons to the photon detector;
a primary beam shielding disposed through the scintillator detector and the light guide;
wherein the scintillator detector has an open area where the primary beam shielding would induce a photon shadow region and the light guide has an open area that substantially conforms in size and position with the open area of the scintillator detector; and
a conductive element maintained at a predetermined electric potential and disposed to interact with charged particles that are directed to impinge upon the open area of the scintillator detector and the open area of the light guide.

54. The charged particle detector of claim 53 wherein the conductive element is disposed within the open area of the scintillator detector, and wherein the defined electric potential is set at a level to deflect the charged particles that are directed to impinge upon the open area away from the open area.

55. The charged particle detector of claim 53 wherein the conductive element is disposed outside the open area of the scintillator detector so that the charged particles that are directed to impinge upon the open area are also directed to impinge upon the conductive element.

56. The charged particle detector of claim 55 wherein the conductive element is coated with an emissive material that produces electrons when the charged particles impinge thereon.

57. The charged particle detector of claim 53 which comprises a power supply that provides a predetermined positive electric potential;
wherein the scintillator detector comprises a scintillating material layer, a conductive layer to provide a scintillator anode which is connected to the power supply, and an insulating base material.

58. The charged particle detector of claim 53 which comprises a power supply that provides a predetermined positive electric potential;
wherein the scintillator detector comprises a scintillating material layer and a conductive layer to provide a scintillator anode which is connected to the power supply, which scintillating material layer and conductive layer are disposed on the light guide.

59. The charged particle detector of claim 53 which further comprises a protective sleeve through which the primary beam shielding protrudes, which protective shield shields a primary particle beam from an electric field of the scintillator detector.

60. The charged particle detector of claim 59 which further includes a power source which applies an electric potential having a level that is substantially equal to an electron beam transport potential for the primary particle beam to one or more of the protective sleeve and the primary beam shielding.

61. The charged particle detector of claim 59 wherein the protective sleeve is an enclosure closed on all sides except for an open side through which the charged particles enter.

62. The charged particle detector of claim 61 wherein a protective grid is disposed in the open side.

63. The charged particle detector of claim 62 wherein the protective grid is electrically connected to the protective sleeve.

64. The charged particle detector of claim 62 wherein the protective grid is electrically isolated from the protective sleeve and is connected to a power supply to bias the protective grid at a predetermined potential.

65. The charged particle detector of claim 64 wherein the predetermined potential is positive.

66. The charged particle detector of claim 64 wherein the predetermined potential is negative.

67. The charged particle detector of claim 62 which further comprises a filter grid disposed inside the protective sleeve and farther from the open side than the protective grid.

68. The charged particle detector of claim 67 wherein the filter grid is connected to a power supply to bias the filter grid at a predetermined level with respect to an electric potential of a sample on which the primary particle beam impinges to produces the charged particles.

69. The charged particle detector of claim 68 wherein the predetermined level is lower than the sample electric potential.

70. The charged particle detector of claim 67 wherein the filter grid is substantially planar and has a shape that substantially conforms to a shape of a cross section of the open side of the protective sleeve.

71. The charged particle detector of claim 67 wherein the protective grid comprises one or more grids, and the filter grid comprises one or more grids.

72. The charged particle detector of claim 67 wherein the filter grid comprises a single or double Micro Channel Plate.

73. The charged particle detector of claim 62 which further comprises a filter grid assembly comprised of multiplicity of filter grids disposed inside the protective sleeve and farther from the open side than the protective grid.

74. The charged particle detector of claim 73 wherein each filter grid of the filter grid assembly is connected to a power supply to bias each filter grid at a predetermined level.

75. The charged particle detector of claim 53 wherein the conductive element is a conductive grid that is disposed in the open area substantially perpendicular to a plane of the scintillator detector and the light guide.

76. The charged particle detector of claim 75 wherein the predetermined electric potential is lower than an electric potential applied to a scintillator anode of the scintillator detector.

77. The charge particle detector of claim 76 wherein the predetermined electric potential is lower than an electric potential of a sample on which the primary particle beam impinges to produces the charged particles.

78. The charged particle detector of claim 53 wherein the conductive element is a conductive grid having a tent-like shape and which is disposed at least partially in and substantially covering the open area of the scintillator detector.

79. The charged particle detector of claim 78 wherein the conductive grid is coated with an emissive material that produces one or more secondary electrons when a charged particle impinges thereon.

80. The charged particle detector of claim 79 wherein the predetermined electric potential is a positive potential.

81. The charged particle detector of claim 79 wherein the predetermined electric potential is a negative potential.

82. The charged particle detector of claim 77 wherein sides of the open area facing the conductive grid are covered with scintillators.

83. The charged particle detector of claim 77 wherein sides of the open area facing the conductive grid are coated with scintillator material.

84. The charged particle detector of claim 53 wherein the conductive element is a conductive grid having a tent-like shape and is disposed a distance away from, but substantially covering the open area of, the scintillator detector.

85. The charged particle detector of claim 84 which further comprises a filter grid disposed substantially parallel to a surface of a scintillator anode of the scintillator detector and between the conductive grid and the scintillator anode.

86. The charged particle detector of claim 85 wherein the predetermined potential is a positive potential above an electron beam transport potential for the primary particle beam.

87. The charged particle detector of claim 86 wherein the filter grid is biased at a positive potential above the electron beam transport potential.

88. The charged particle detector of claim 62 wherein the protective grid comprises a single or double Micro Channel Plate.

89. The charged particle detector of claim 53 wherein the conductive element is a conductive grid in a shape of a truncated cone of a hollow cylindrical projection at one end, which one end is disposed at an end of the primary beam shielding or a predetermined distance from the end of the primary beam shielding.

90. The charged particle detector of claim 89 wherein the cone has a surface that is coated with an emissive material.

91. The charged particle detector of claim 90 which further comprises one or more of a filter grid, a filter grid assembly, and a Micro Channel Plate disposed between the conductive grid and a scintillator anode of the scintillator detector.

* * * * *